US 6,558,470 B2

(12) United States Patent
Curtis et al.

(10) Patent No.: US 6,558,470 B2
(45) Date of Patent: *May 6, 2003

(54) REACTOR FOR PROCESSING A MICROELECTRONIC WORKPIECE

(75) Inventors: Gary L. Curtis, Kila, MT (US); Raymon F. Thompson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 39 days.

This patent is subject to a terminal disclaimer.

(21) Appl. No.: 09/845,462

(22) Filed: Apr. 30, 2001

(65) Prior Publication Data

US 2001/0015176 A1 Aug. 23, 2001

Related U.S. Application Data

(63) Continuation of application No. 09/113,435, filed on Jul. 10, 1998, now Pat. No. 6,264,752, which is a continuation-in-part of application No. 09/041,901, filed on Mar. 13, 1998, now Pat. No. 6,350,319.

(51) Int. Cl.[7] .......................... B08B 3/02; H01L 41/00; C23C 16/00
(52) U.S. Cl. ...................... 118/500; 118/729; 118/730; 156/345.12
(58) Field of Search ................................ 118/729, 730, 118/500; 156/345.12

(56) References Cited

U.S. PATENT DOCUMENTS

| | | | |
|---|---|---|---|
| 3,727,620 A | 4/1973 | Orr | |
| 3,953,265 A | 4/1976 | Hood | |
| 4,132,567 A | 1/1979 | Blackwood | |
| 4,439,243 A | 3/1984 | Titus | |
| 4,439,244 A | 3/1984 | Allevato | |
| 4,544,446 A | 10/1985 | Cady | |
| 4,664,133 A | 5/1987 | Silvernail et al. | |

(List continued on next page.)

FOREIGN PATENT DOCUMENTS

| | | |
|---|---|---|
| JP | 59-208831 | 11/1984 |
| JP | 60-137016 | 7/1985 |
| JP | 61-196534 | 8/1986 |
| JP | 62-166515 | 7/1987 |
| JP | 63-185029 | 7/1988 |
| JP | 1-120023 | 5/1989 |
| JP | 4 94537 | 3/1992 |
| JP | 5-13322 | 1/1993 |
| JP | 5-21332 | 1/1993 |
| JP | 5-326483 | 12/1993 |
| JP | 6-45302 | 2/1994 |
| JP | 52-12576 | 1/1997 |
| JP | 1-283845 | 11/1999 |

*Primary Examiner*—Gregory Mills
*Assistant Examiner*—Sylvia R. MacArthur
(74) *Attorney, Agent, or Firm*—Perkins Coie LLP

(57) ABSTRACT

An apparatus for processing a microelectronic workpiece in a micro-environment is set forth. The apparatus includes a first chamber member having an interior chamber wall and a second chamber member having an interior chamber wall. The first and second chamber members are adapted for relative movement between a loading position in which the first and second chamber members are distal one another and a processing position in which the first and second chamber members are proximate one another to define a processing chamber. At least one workpiece support assembly is disposed between the first and second chamber members for supporting the microelectronic workpiece. The workpiece support assembly is operable to space the workpiece a first distance, x1, from an interior chamber wall of at least one of the first and second chamber members when the first and second chamber members are in the loading position and to space the workpiece a second distance, x2, from the interior chamber wall when the first and second chamber members are in the processing position, wherein x1>x2.

15 Claims, 14 Drawing Sheets

U.S. PATENT DOCUMENTS

| | | |
|---|---|---|
| 4,750,505 A | 6/1988 | Inuta et al. |
| 4,790,262 A | 12/1988 | Nakayama et al. |
| 4,838,289 A | 6/1989 | Kottman et al. |
| 4,903,717 A | 2/1990 | Sumnitsch |
| 4,982,215 A | 1/1991 | Matsuoka |
| 4,982,753 A | 1/1991 | Grebinski, Jr. et al. |
| 5,020,200 A | 6/1991 | Mimasaka |
| 5,032,217 A | 7/1991 | Tanaka |
| 5,117,769 A | 6/1992 | DeBoer |
| 5,168,886 A | 12/1992 | Thompson et al. |
| 5,209,180 A | 5/1993 | Shoda et al. |
| 5,222,310 A | 6/1993 | Thompson et al. |
| 5,224,503 A | 7/1993 | Thompson et al. |
| 5,224,504 A | 7/1993 | Thompson et al. |
| 5,349,978 A | 9/1994 | Sago et al. |
| 5,361,449 A | 11/1994 | Akimoto |
| 5,421,893 A | 6/1995 | Perlov |
| 5,431,421 A | 7/1995 | Thompson et al. |
| 5,445,172 A | 8/1995 | Thompson et al. |
| 5,513,594 A | 5/1996 | McClanahan et al. |
| 5,551,986 A | 9/1996 | Jain |
| 5,591,262 A | 1/1997 | Sago et al. |
| 5,616,069 A | 4/1997 | Walker et al. |
| 5,666,985 A | 9/1997 | Smith, Jr. et al. |
| 5,677,824 A | 10/1997 | Harashima et al. |
| 5,678,116 A | 10/1997 | Sugimoto et al. |
| 5,718,763 A | 2/1998 | Tateyama et al. |
| 5,762,708 A | 6/1998 | Motoda et al. |
| 5,762,751 A | 6/1998 | Bleck et al. |
| 5,779,796 A | 7/1998 | Tomoeda et al. |
| 5,815,762 A | 9/1998 | Sakai et al. |
| 5,845,662 A | 12/1998 | Sumnitsch |
| 5,860,640 A | 1/1999 | Marohl et al. |
| 5,868,866 A | 2/1999 | Maekawa et al. |
| 5,882,433 A | 3/1999 | Ueno |
| 5,885,755 A | 3/1999 | Nakagawa et al. |
| 5,916,366 A | 6/1999 | Ueyama et al. |
| 5,942,035 A | 8/1999 | Hasebe et al. |
| 5,997,653 A | 12/1999 | Yamasaka |
| 6,264,752 B1 * | 7/2001 | Curtis et al. ................. 118/729 |
| 6,413,436 B1 * | 7/2002 | Aegerter et al. ............... 216/13 |
| 6,423,642 B1 * | 7/2002 | Peace et al. ................. 438/694 |

* cited by examiner

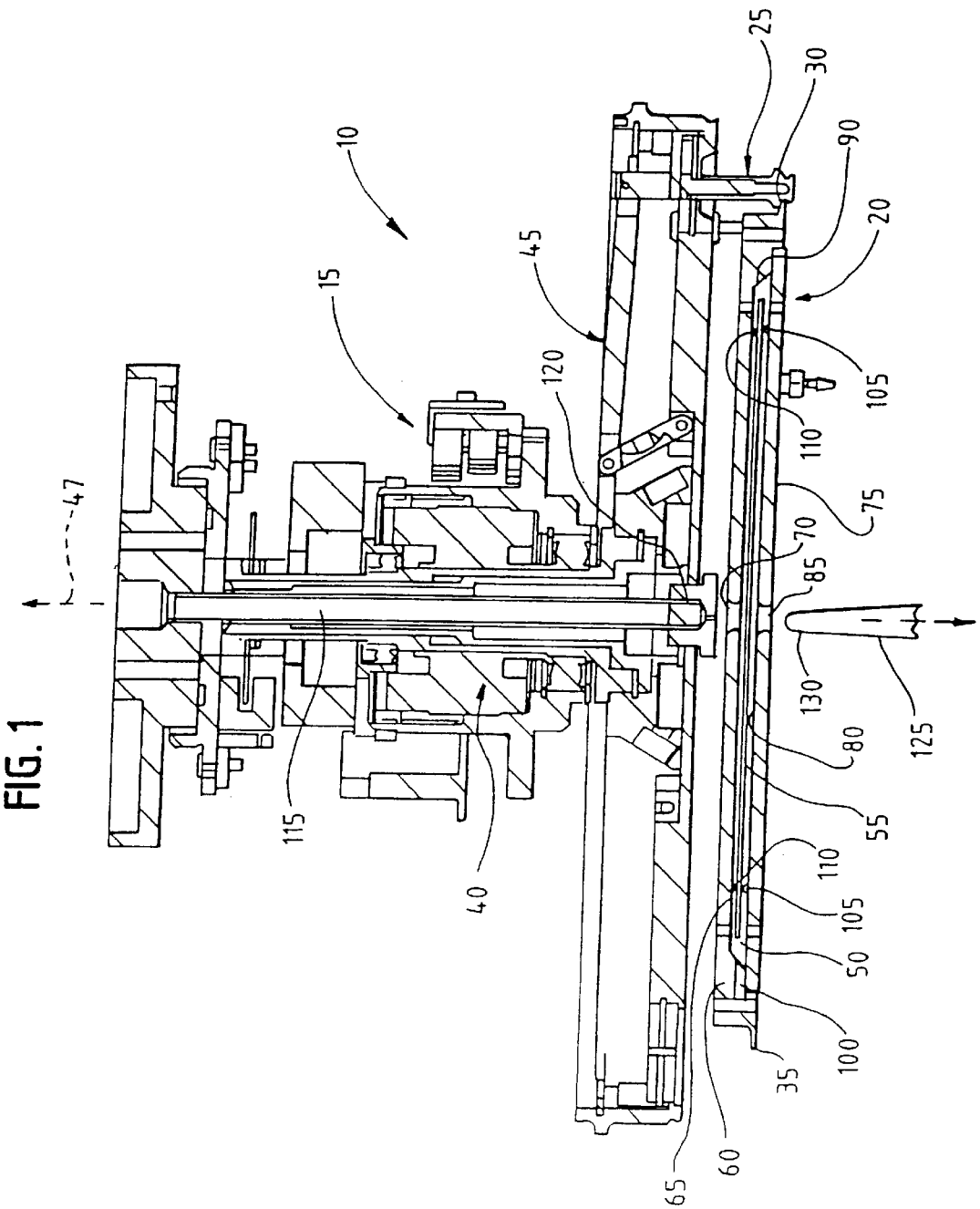

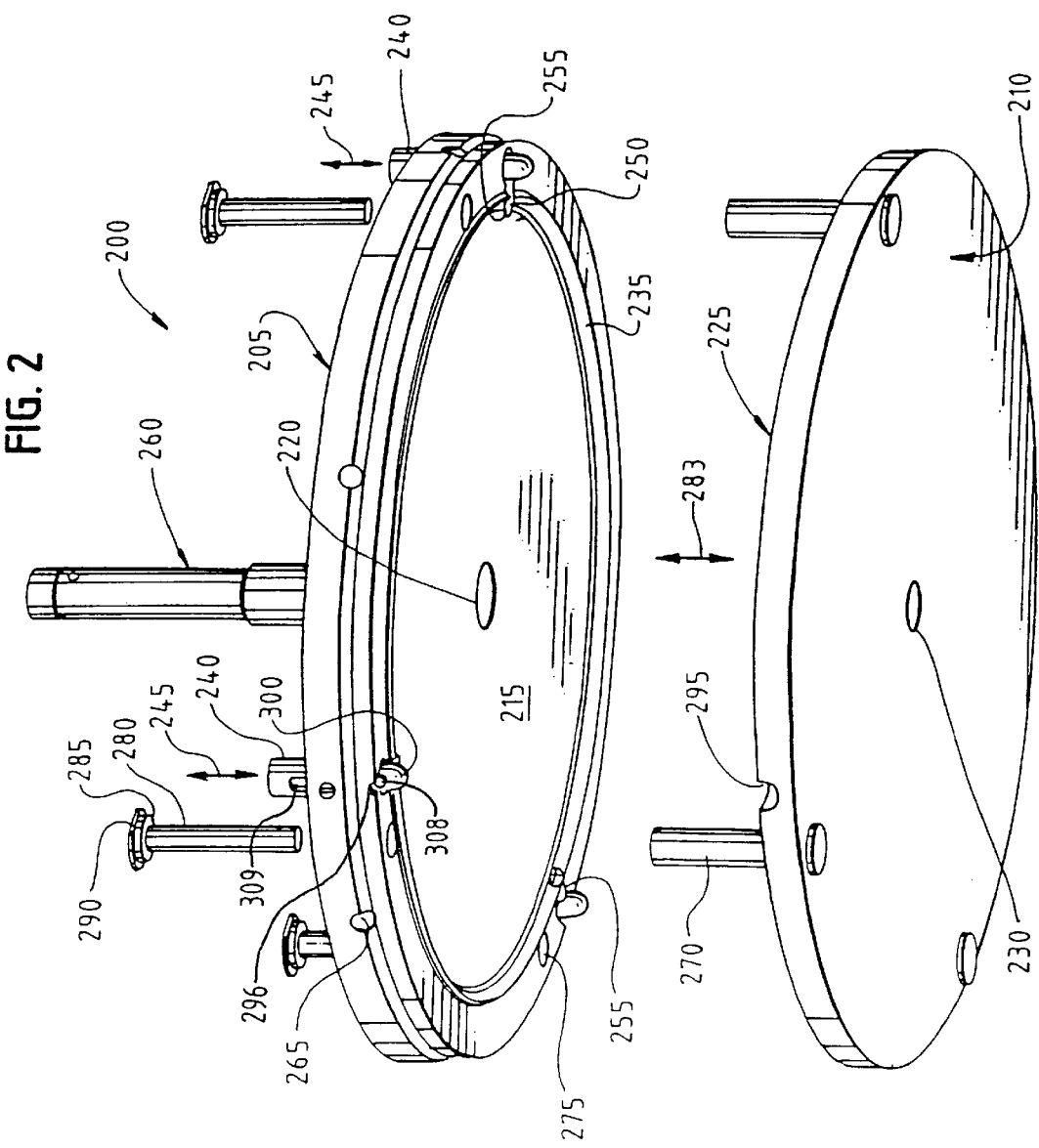

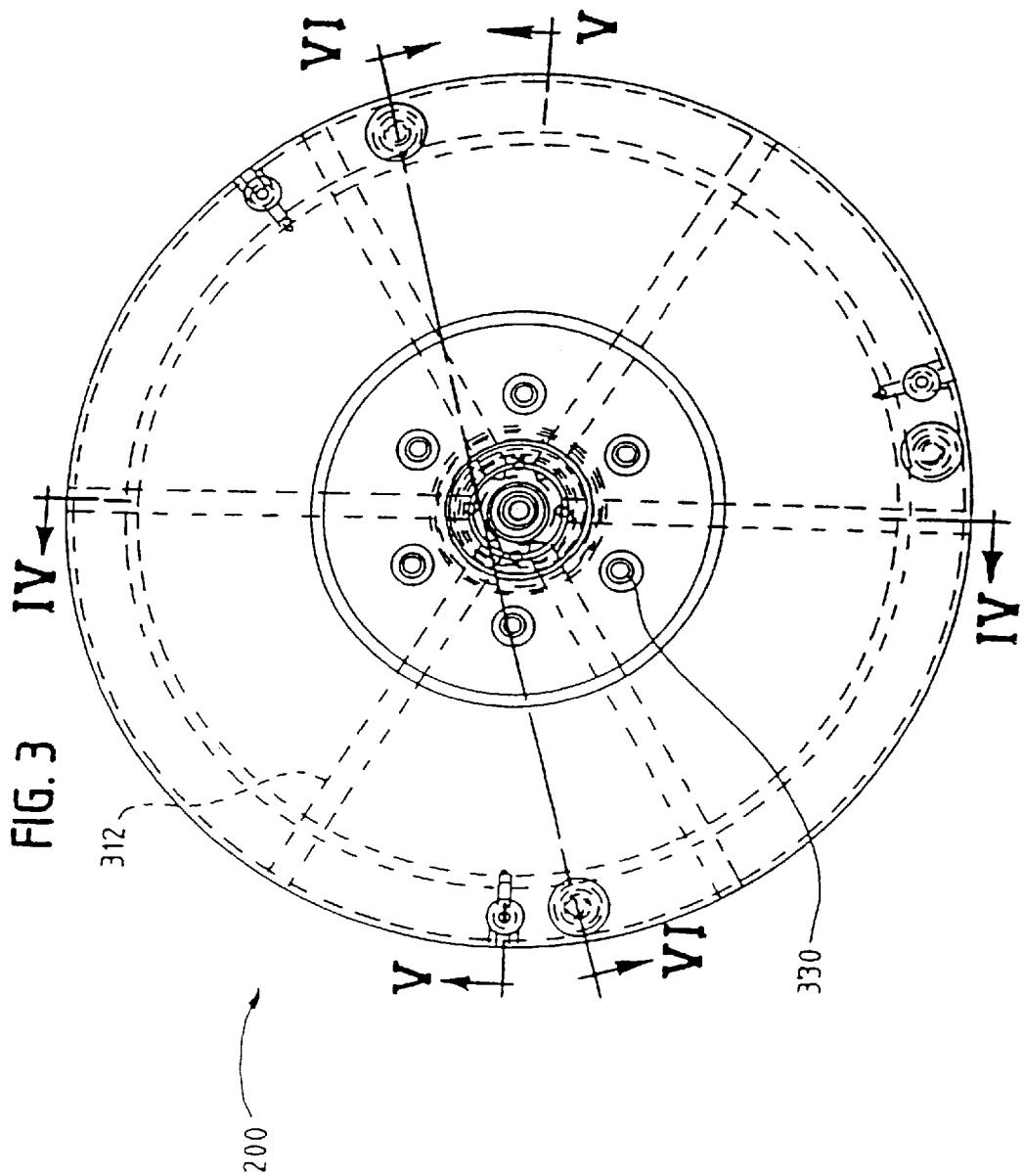

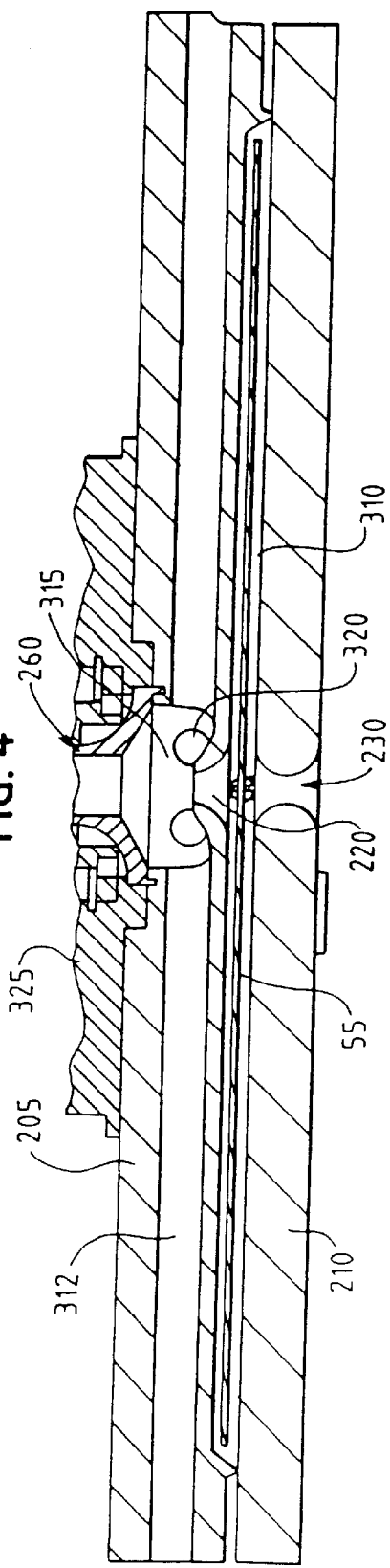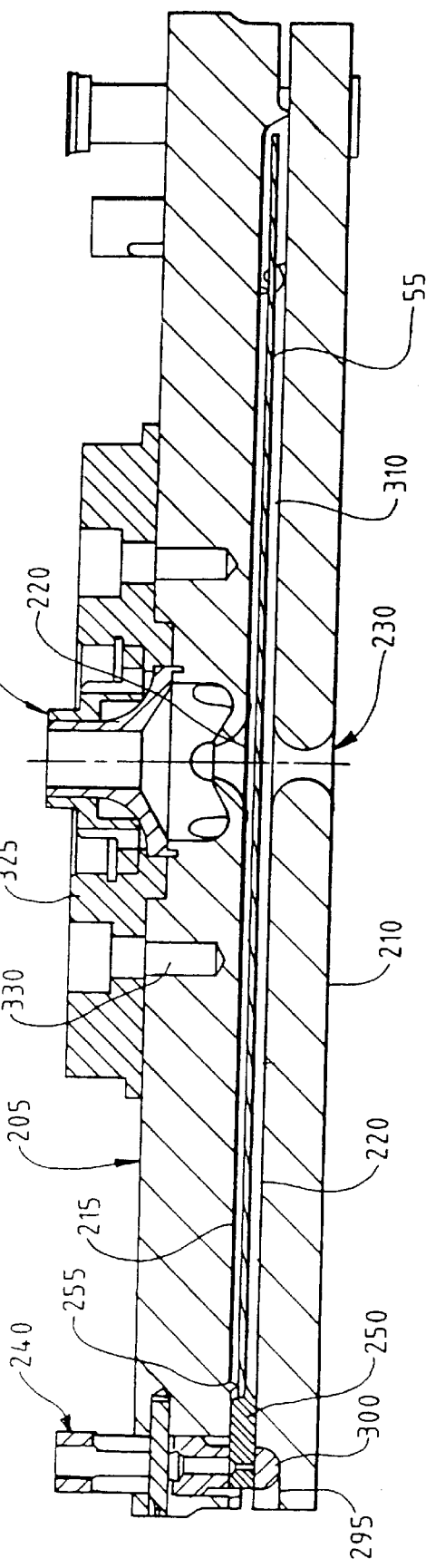

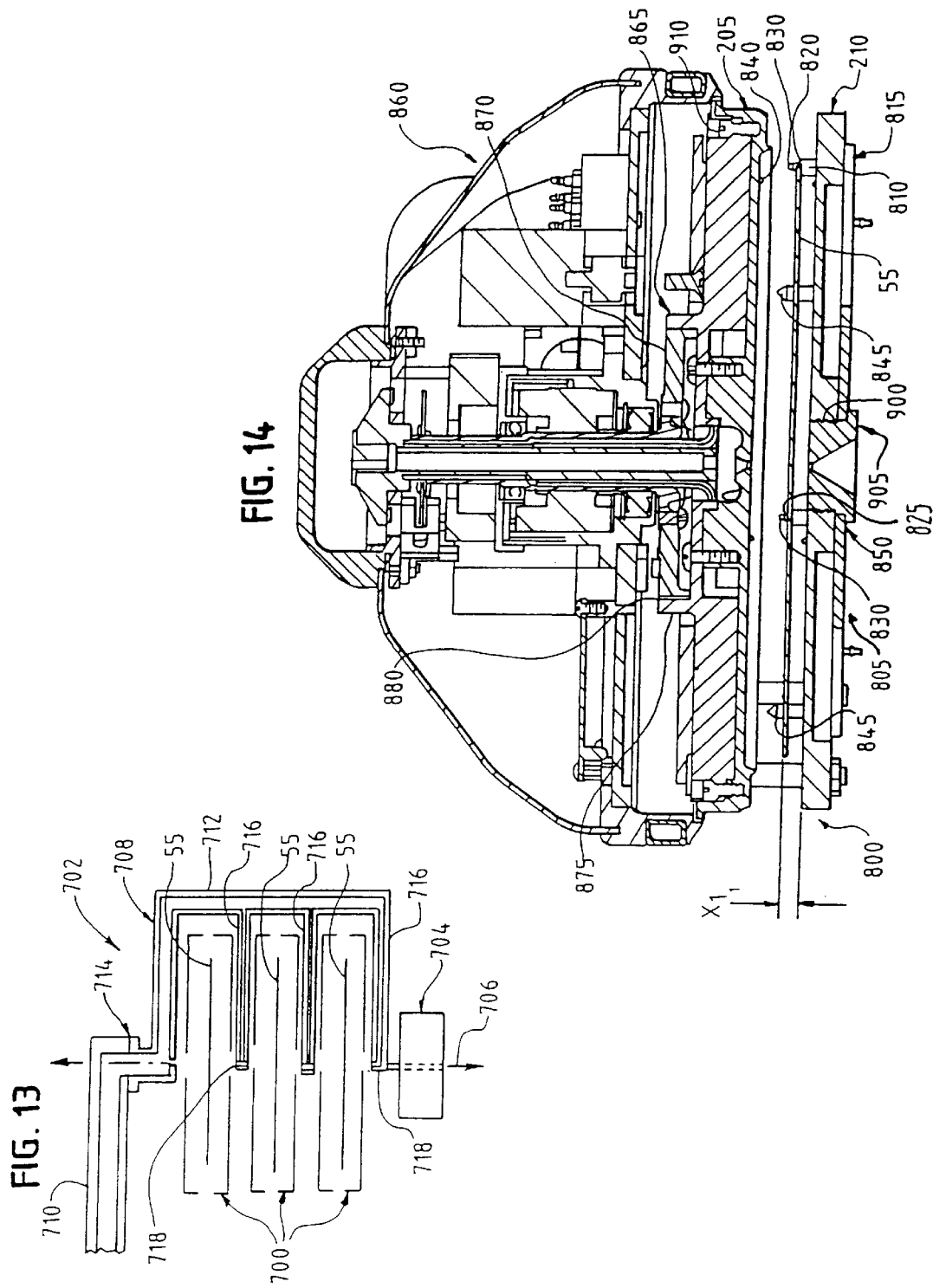

REACTOR FOR PROCESSING A MICROELECTRONIC WORKPIECE

This application is a Continuation of Ser. No. 09/113,435, filed Jul. 10, 1998, and now U.S. Pat. No. 6,264,752, which is a Continuation-in-part of Ser. No. 09/041,901, filed Mar. 13, 1998, and now U.S. Pat. No. 6,350,319. Priority to these Applications is claimed under 35 USC §120 and these Applications are incorporated herein by reference.

BACKGROUND OF THE INVENTION

The semiconductor manufacturing industry is constantly seeking to improve the processes used to manufacture integrated circuits from wafers. The improvements come in various forms but, generally, have one or more objectives as the desired goal. The objectives of many of these improved processes include: 1) decreasing the amount of time required to process a wafer to form the desired integrated circuits; 2) increasing the yield of usable integrated circuits per wafer by, for example, decreasing the likelihood of contamination of the wafer during processing; 3) reducing the number of steps required to turn a wafer into the desired integrated circuits; and 4) reducing the cost of processing the wafers into the desired integrated circuit by, for example, reducing the costs associated with the chemicals required for the processing.

In the processing of wafers, it is often necessary to subject one or more sides of the wafer to a fluid in either liquid, vapor or gaseous form. Such fluids are used to, for example, etch the wafer surface, clean the wafer surface, dry the wafer surface, passivate the wafer surface, deposit films on the wafer surface, etc. Control of the physical parameters of the processing fluids, such as their temperature, molecular composition, dosing, etc., is often quite crucial to the success of the processing operations. As such, the introduction of such fluids to the surface of the wafer occurs in a controlled environment. Typically, such wafer processing occurs in what has commonly become known as a reactor.

These reactors have been quite useful for many of the fluid processing steps employed in the production of an integrated circuit. However, it has now been recognized that demands for future integrated circuits manufacturing processes may ultimately require more control and economic efficiency from the reactor. As such, a substantially new approach to processing and reactor design has been undertaken which provides greater control of the fluid processes currently used in connection with microelectronic manufacturing, and, further, provides for the implementation and execution of more advanced and improved processes. Additionally, the reactor includes several advantageous mechanical features including those that allow the reactor to be used with robotic wafer transfer equipment, those that allow the reactor to be readily re-configured for different processes, and those that allow the processing chamber of the reactor to be easily removed and serviced.

BRIEF SUMMARY OF THE INVENTION

An apparatus for processing a microelectronic workpiece includes a first chamber member having an interior chamber wall and a second chamber member each having an interior chamber wall. The first and second chamber members are adapted for relative movement between a loading position in which the first and second chamber members are spaced apart, and a processing position in which the first and second chamber members are adjacent or engaged to each other, to define a processing chamber. At least one workpiece support assembly is disposed between the first and second chamber members for supporting the microelectronic workpiece. The workpiece support assembly supports the workpiece spaced apart from the interior chamber wall of the first or second chamber members when they are in the loading position. The workpiece support assembly also supports the workpiece adjacent, or closer to the interior chamber wall when the first and second chamber members are in the processing position.

In accordance with one embodiment of the invention, the workpiece support assembly includes a workpiece support member and a biasing member disposed to engage the workpiece support member. In operation, the biasing member urges the workpiece support member to space the workpiece away from the interior chamber wall when the first and second chamber members are in the loading position. Upon relative movement of the first and second chambers to the processing position, the first and second chamber members urge the workpiece support member against the bias of the biasing member, and the workpiece is moved to a position closer to the interior chamber walls of the chamber members. The biasing member may be, for example, a coil spring actuator or a leaf spring.

In accordance with a further embodiment of the present invention, the apparatus includes an upper chamber member having an interior chamber wall and a lower chamber member having an interior chamber wall. As in the previous embodiment, the upper chamber member and the lower chamber are adapted for relative movement between a loading position in which the upper and lower chamber members are distal one another and a processing position in which the upper and lower chamber members are proximate one another. While in the processing position, the chamber members are effectively joined to each other to form a substantially closed processing chamber that generally conforms to the shape of the workpiece. The substantially closed processing chamber has at least one fluid outlet disposed at a peripheral region thereof. Further, at least one processing fluid inlet is disposed through at least one of the interior chamber walls for providing a processing fluid onto a surface of the workpiece, when the upper and lower chamber members are in the processing position. A workpiece support assembly is disposed between the upper and lower chamber members for supporting the workpiece in a loading position or in a processing position.

The upper and lower chamber members are attached to each other and rotated by a rotor drive when the members are in the processing position. The workpiece support is adapted to support the workpiece in the substantially closed processing chamber in a position to allow distribution of a fluid supplied through the at least one processing fluid inlet across at least one face of the microelectronic workpiece by centrifugal acceleration when the chamber members are rotated by the rotor drive during processing.

In accordance with one aspect of the invention, the workpiece support assembly includes a plurality of workpiece support members having an upstanding portion and a support surface. The assembly also includes a biasing member that is diposed to engage the upstanding portions of the plurality workpiece support member. The biasing member urges the workpiece support member to space the workpiece away from the interior chamber wall when the first and second chamber members are in the loading position. Relative movement of the first and second chamber members together pushes the workpiece support members down against the bias of the biasing member to the processing position.

The biasing member may be in the form of a plurality of leaf spring members extending from a central hub. End portions of the leaf spring members may then contact respective upstanding members of the workpiece supports.

The plurality of workpiece support members may be disposed through the lower chamber member and the biasing member may secured to the lower chamber member at the hub of the biasing member by a securement that forms the processing fluid inlet of the lower chamber member. In such instances, the size and the shape of the processing fluid inlet may be easily changed by merely replacing a securement having a first inlet configuration with a securement having another inlet configuration.

BRIEF DESCRIPTION OF THE SEVERAL VIEWS OF THE DRAWINGS

FIG. 1 is a cross-sectional view of a microelectronic workpiece housing and a rotor assembly constructed in accordance with one embodiment of the invention.

FIG. 2 is an exploded view of a further embodiment of a microelectronic workpiece housing constructed in accordance with the teachings of the present invention.

FIG. 3 is a top plan view of the workpiece housing of FIG. 2 when the housing is in an assembled state.

FIG. 4 is a cross-sectional view of the workpiece housing taken along line IV—IV of FIG. 3.

FIG. 5 is a cross-sectional view of the workpiece housing taken along line V—V of FIG. 3.

FIG. 13 illustrates a batch wafer processing tool constructed in accordance with the principles of the present invention.

FIG. 14 illustrates a further embodiment of a reactor including features that render it well-suited for integration with workpiece transfer automation equipment, wherein the reactor is in an open state for loading/unloading a workpiece that is to be processed.

DETAILED DESCRIPTION OF TEE INVENTION

Figure 6:
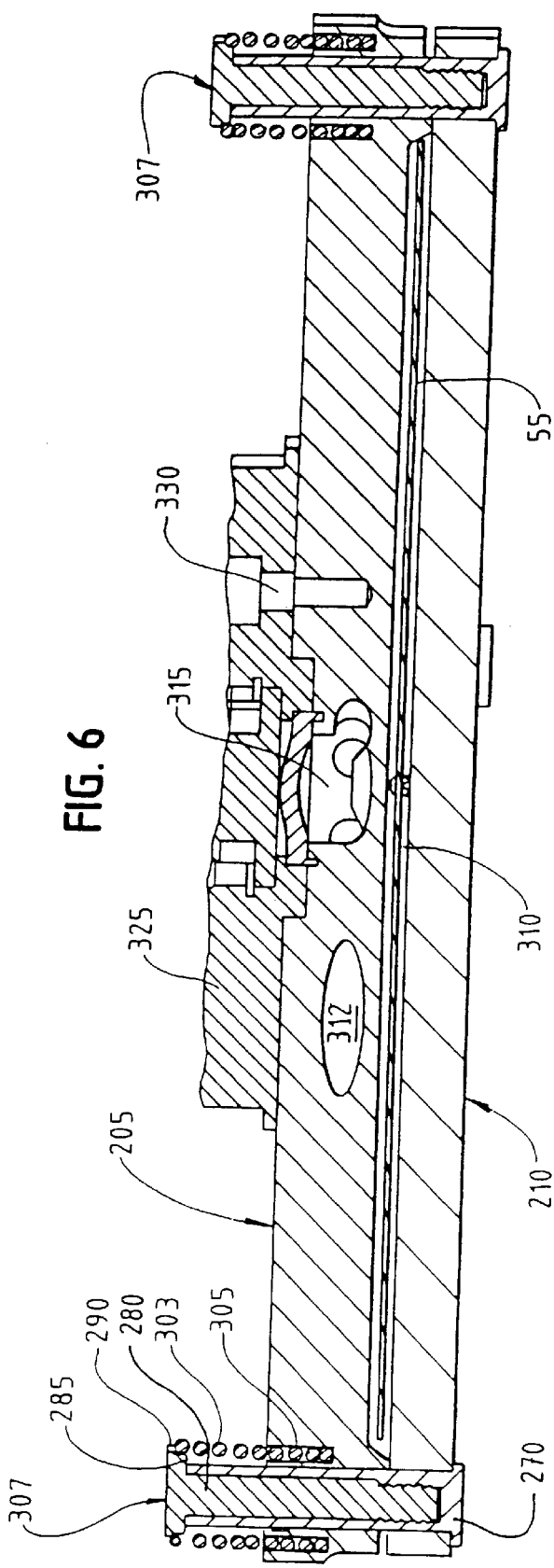
FIG. 6 is a cross-sectional view of the workpiece housing taken along line VI—VI of FIG. 3.

FIG. 1 is a cross-sectional view of one embodiment of a reactor, shown generally at 10, constructed in accordance with the teachings of the present invention. The embodiment of the reactor 10 of FIG. 1 is generally comprised of a rotor portion 15 and a microelectronic workpiece housing 20. The rotor portion 15 includes a plurality of support members 25 that extend downwardly from the rotor portion 15 to engage the workpiece housing 20. Each of the support members 25 includes a groove 30 that is dimensioned to engage a radially extending flange 35 that extends about a peripheral region of the workpiece housing 20. Rotor portion 15 further includes a rotor motor assembly 40 that is disposed to rotate a hub portion 45, including the support members 25, about a central axis 47. Workpiece housing 20 is thus secured for co-rotation with hub portion 45 when support members 25 are engaged with flange 35. Other constructions of the rotor portion 15 and the engagement mechanism used for securement with the workpiece housing 20 may also be used.

The workpiece housing 20 of the embodiment of FIG. 1 defines a substantially closed processing chamber 50. Preferably, the substantially closed processing chamber 50 is formed in the general shape of the microelectronic workpiece 55 and closely conforms with the surfaces of the workpiece. The specific construction of FIG. 1 includes an upper chamber member 60 having an interior chamber face 65. The upper chamber member 60 includes a centrally disposed fluid inlet opening 70 in the interior chamber face 65. The specific construction also includes a lower chamber member 75 having an interior chamber face 80. The lower chamber member 75 has a centrally disposed fluid inlet opening 85 in the interior chamber face 80. The upper chamber member 60 and the lower chamber member 75 engage one another to define the processing chamber 50. The upper chamber member 60 includes sidewalls 90 that project downward from the interior chamber face 65. One or more outlets 100 are disposed at the peripheral regions of the processing chamber 50 through the sidewalls 90 to allow fluid within the chamber 50 to exit therefrom through centripetal acceleration that is generated when the housing 20 is rotated about axis 47.

In the illustrated embodiment, the microelectronic workpiece 55 is a generally circular wafer having upper and lower planar surfaces. As such, the a processing chamber 50 is generally circular in plan view and the interior chamber faces 65 and 80 are generally planar and parallel to the upper and lower planar surfaces of the workpiece 55. The spacing between the interior chamber faces 65 and 80 and the upper and lower planar surfaces of the workpiece 55 is generally quite small. Such spacing is preferably minimized to provide substantial control of the physical properties of a processing fluid flowing through the interstitial regions.

The wafer 55 is spaced from the interior chamber face 80 by a plurality of spacing members 105 extending from the interior chamber face 80. Preferably, a further set of spacing members 110 extend from the interior chamber face 65 and are aligned with the spacing members 105 to grip the wafer 55 therebetween.

Fluid inlet openings 70 and 85 provide communication passageways through which one or more processing fluids may enter the chamber 50 for processing the wafer surfaces. In the illustrated embodiment, processing fluids are delivered from above the wafer 55 to inlet 70 through a fluid supply tube 115 having a fluid outlet nozzle 120 disposed proximate inlet 70. Fluid supply tube 115 extends centrally through the rotor portion 15 and is preferably concentric with the axis of rotation 47. Similarly, processing fluids are delivered from below the wafer 55 to inlet 85 through a fluid supply tube 125. Fluid supply tube 125 terminates at a nozzle 130 disposed proximate inlet 85. Although nozzles 120 and 130 terminate at a position that is spaced from their respective inlets, it will be recognized that tubes 115 and 125 may be extended so that gaps 135 are not present. Rather, nozzles 120 and 130 or tubes 115 and 125 may include rotating seal members that abut and seal with the respective upper and lower chamber members 60 and 75 in the regions of the inlets 70 and 85. In such instances, care should be exercised in the design of the rotating joint so as to minimize any contamination resulting from the wear of any moving component.

During processing, one or more processing fluids are individually or concurrently supplied through fluid supply tubes 115 and 125 and inlets 70 and 85 for contact with the surfaces of the workpiece 55 in the chamber 50. Preferably, the housing 20 is rotated about axis 47 by the rotor portion 15 during processing to generate a continuous flow of any fluid within the chamber 50 across the surfaces of the workpiece 55 through the action of centripetal acceleration. Processing fluid entering the inlet openings 70 and 85 are thus driven across the workpiece surfaces in a direction radially outward from the center of the workpiece 55 to the exterior perimeter of the workpiece 55. At the exterior perimeter of the workpiece 55, any spent processing fluid is directed to exit the chamber 50 through outlets 100 as a result of the centripetal acceleration. Spent processing fluids may be accumulated in a cup reservoir disposed below and/or about the workpiece housing 20. As will be set forth below in an alternative embodiment, the peripheral regions of the workpiece housing 20 may be constructed to effectively separate the processing fluids provided through inlet 70 from the processing fluids supplied through inlet 85 so that opposite surfaces of wafer 55 are processed using different processing fluids. In such an arrangement, the processing fluids may be separately accumulated at the peripheral regions of the housing 20 for disposal or re-circulation.

In the embodiment of FIG. 1, the workpiece housing 20 may constitute a single wafer pod that may be used to transport the workpiece 55 between various processing stations and/or tools. If transport of the housing 20 between the processing stations and/or tools takes place in a clean room environment, the various openings of the housing 20 need not be sealed. However, if such transport is to take place in an environment in which wafer contaminants are present, sealing of the various housing openings should be effected. For example, inlets 70 and 85 may each be provided with respective polymer diaphragms having slits disposed therethrough. The ends of fluid supply tubes 115 and 125 in such instances may each terminate in a tracor structure that may be used to extend through the slit of the respective diaphragm and introduce the processing fluid into the chamber 50. Such tracor/slitted diaphragm constructions are used in the medical industry in intravenous supply devices. Selection of the polymer material used for the diaphragms should take into consideration the particular processing fluids that will be introduced therethrough. Similar sealing of the outlets 100 may be undertaken in which the tracor structures are inserted into the diaphragms once the housing 20 is in a clean room environment.

Alternatively, the outlets 100 themselves may be constructed to allow fluids from the processing chamber to exit therethrough while inhibiting the ability of fluids to proceed from the exterior of housing 20 into chamber 50. This effect may be achieved, for example, by constructing the openings 100 as nozzles in which the fluid flow opening has a larger diameter at the interior of chamber 50 than the diameter of the opening at the exterior of the housing 20. In a further construction, a rotational valve member may be used in conjunction with the plurality of outlets 100. The valve member, such as a ring with openings corresponding to the position of outlets 100 is rotated to seal with the outlets 100 during transport. The valve member would be rotated to a position in which outlets 100 are open during processing. Inert gas, such as nitrogen, can be injected into the chamber 50 through supply tubes 115 and 125 immediately prior to transport of the housing to a subsequent tool or processing station. Various other mechanisms for sealing the outlets 100 and inlets 70 and 85 may also be employed.

FIG. 2 is a perspective view of a further reactor construction wherein the reactor is disposed at a fixed processing station and can open and close to facilitate insertion and extraction of the workpiece. The reactor, shown generally at 200, is comprised of separable upper and lower chamber members, 205 and 210, respectively. As in the prior embodiment, the upper chamber member 205 includes a generally planar chamber face 215 having a centrally disposed inlet 220. Although not shown in the view of FIG. 2, the lower chamber member 210 likewise has a generally planar interior chamber face 225 having a central inlet 230 disposed therethrough. The upper chamber member 205 includes a downwardly extending sidewall 235 that, for example, may be formed from a sealing polymer material or may be formed integrally with other portions of member 205.

The upper and lower chamber members, 205 and 210, are separable from one another to accept a workpiece therebetween. With a workpiece disposed between them, the upper and lower chamber members, 205 and 210, move toward one another to form a chamber in which the workpiece is supported in a position in which it is spaced from the planar interior chamber faces 215 and 225. In the embodiment of the reactor disclosed in FIGS. 2–8B, the workpiece, such as a semiconductor wafer, is clamped in place between a plurality of support members 240 and corresponding spacing members 255 when the upper and lower chamber members are joined to form the chamber (see FIG. 7B). Axial movement of the upper and lower chamber members toward and away from each other is facilitated by a plurality of fasteners 307, the construction of which will be described in further detail below. Preferably, the plurality of fasteners 307 bias the upper and lower chambers to a closed position such as illustrated at FIG. 7A.

In the disclosed embodiment, the plurality of wafer support members 240 extend about a peripheral region of the upper chamber member 205 at positions that are radially exterior of the sidewall 235. The wafer support members 240 are preferably disposed for linear movement along respective axes 245 to allow the support members 240 to clamp the wafer against the spacing members 255 when the upper and lower chamber members are in a closed position (see FIG. 7A), and to allow the support members 240 to release the wafer from such clamping action when the upper and lower chamber members are separated (see FIG. 8A). Each support member 240 includes a support arm 250 that extends radially toward the center of the upper chamber member 205. An end portion of each arm 250 overlies a corresponding spacing member 255 that extends from the interior chamber face 215. Preferably, the spacing members 255 are each in the form of a cone having a vertex terminating proximate the end of the support arm 250. Notches 295 are disposed at peripheral portions of the lower chamber member 210 and engage rounded lower portions 300 of the wafer support members 240. When the lower chamber member 210 is urged upward to the closed position, notches 295 engage end portions 300 of the support members 240 and drive them upward to secure the wafer 55 between the arms 250 of the supports 240 and the corresponding spacing members 255. This closed state is illustrated in FIG. 5. In the closed position, the notches 295 and corresponding notches 296 of the upper chamber member (see FIG. 2) provide a plurality of outlets at the peripheral regions of the reactor 200. Radial alignment of the arm 250 of each support member 240 is maintained by a set pin 308 that extends through lateral grooves 309 disposed through an upper portion of each support member.

Figure 7A:
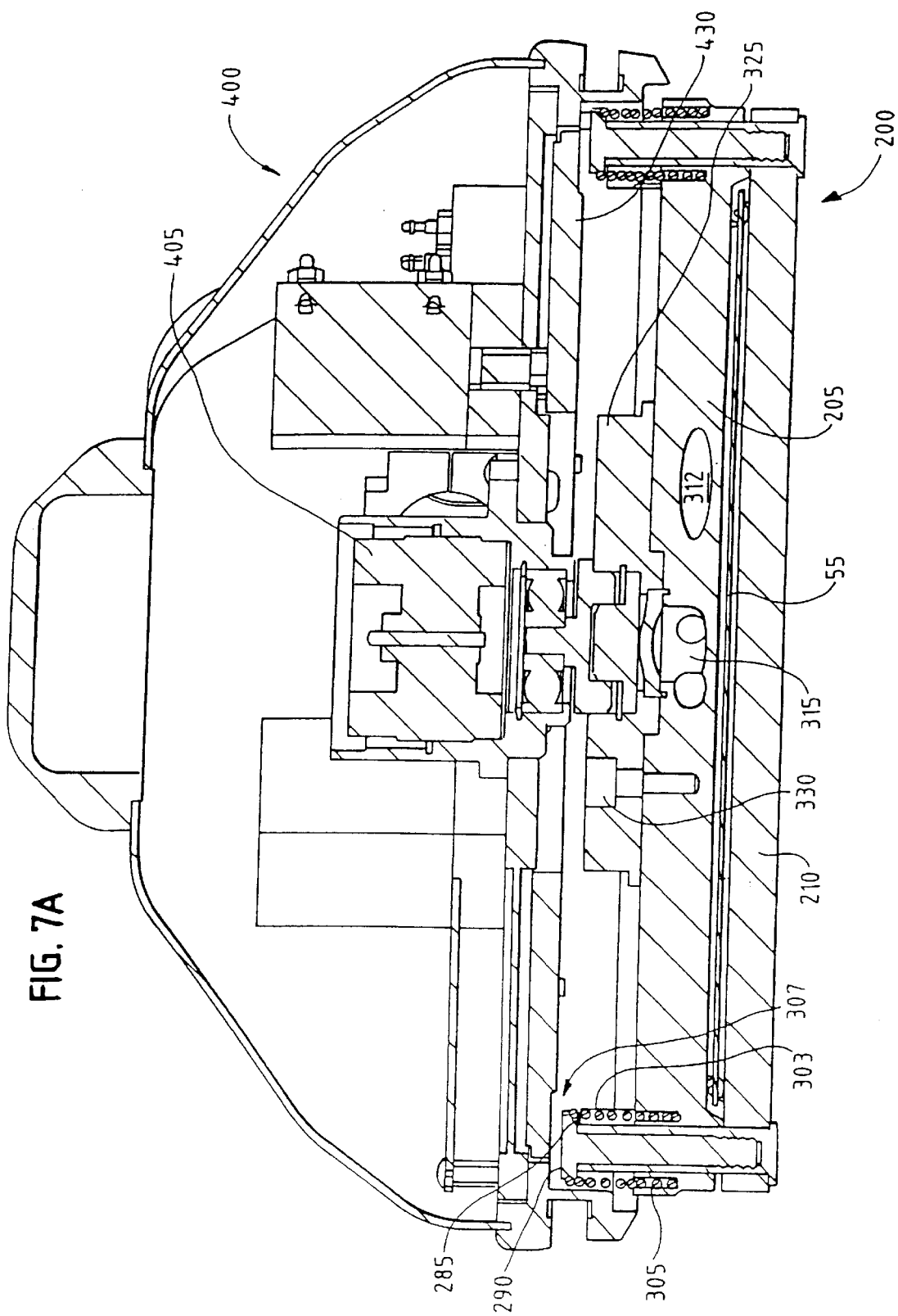
FIGS. 7A and 7B are cross-sectional views showing the workpiece housing in a closed state and connected to a rotary drive assembly.
Figure 7B:
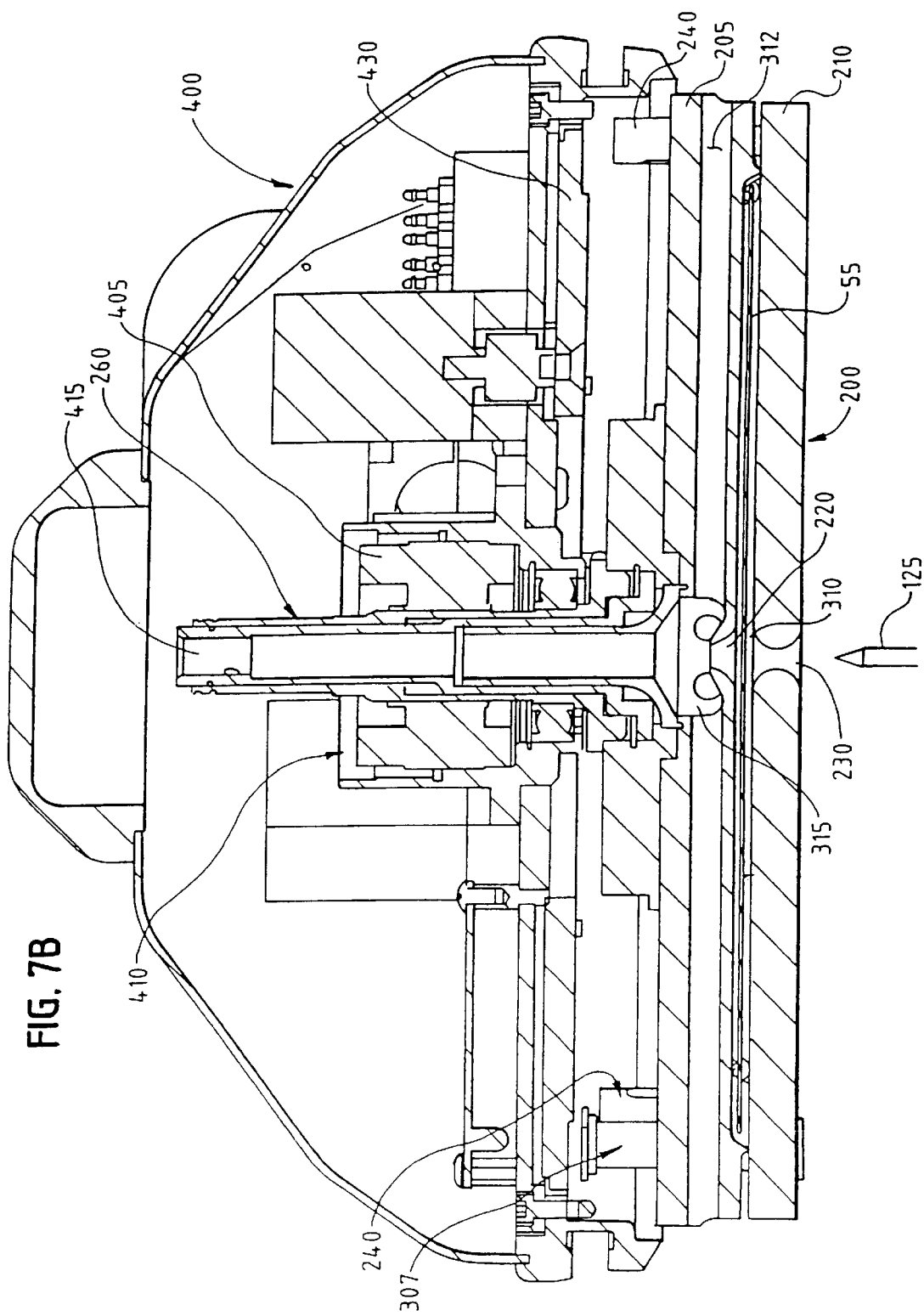

The construction of the fasteners 307 that allow the upper and lower chamber members to be moved toward and away from one another is illustrated in FIGS. 2, 6 and 7B. As shown, the lower chamber member 210 includes a plurality of hollow cylinders 270 that are fixed thereto and extend upward through corresponding apertures 275 at the peripheral region of the upper chamber member 205 to form lower portions of each fastener 307. Rods 280 extend into the hollow of the cylinders 270 and are secured to form an upper portion of each fastener 307. Together, the rods 280 and cylinders 270 form the fasteners 307 that allow relative linear movement between the upper and lower chamber members, 205 and 210, along axis 283 between the open and closed position. Two flanges, 285 and 290, are disposed at an upper portion of each rod 280. Flange 285 functions as a stop member that limits the extent of separation between the upper and lower chamber members, 205 and 210, in the open position. Flanges 290 provide a surface against which a biasing member, such as a spring (see FIG. 6) or the like, acts to bias the upper and lower chamber members, 205 and 210, to the closed position.

With reference to FIG. 6, the spring 303 or the like, has a first end that is positioned within a circular groove 305 that extends about each respective fastener 307. A second end of each spring is disposed to engage flange 290 of the respective fastener 307 in a compressed state thereby causing the spring to generate a force that drives the fastener 307 and the lower chamber member 210 upward into engagement with the upper chamber member 205.

The reactor 200 is designed to be rotated about a central axis during processing of the workpiece. To this end, a centrally disposed shaft 260 extends from an upper portion of the upper chamber member 205. As will be illustrated in further detail below in FIGS. 7A–8B, the shaft 260 is connected to engage a rotary drive motor for rotational drive of the reactor 200. The shaft 260 is constructed to have a centrally disposed fluid passageway (see FIG. 4) through which a processing fluid may be provided to inlet 220. Alternatively, the central passageway may function as a conduit for a separate fluid inlet tube or the like.

As illustrated in FIGS. 3 and 4, a plurality of optional overflow passageways 312 extend radially from a central portion of the upper chamber member 205. Shaft 260 terminates in a flared end portion 315 having inlet notches 320 that provide fluid communication between the upper portion of processing chamber 310 and the overflow passageways 312. The flared end 315 of the shaft 260 is secured with the upper chamber member 205 with, for example, a mounting plate 325. Mounting plate 325, in turn, is secured to the upper chamber member 205 with a plurality of fasteners 330 (FIG. 5). Overflow passages 312 allow processing fluid to exit the chamber 310 when the flow of fluid to the chamber 310 exceeds the fluid flow from the peripheral outlets of the chamber.

Figure 8A:
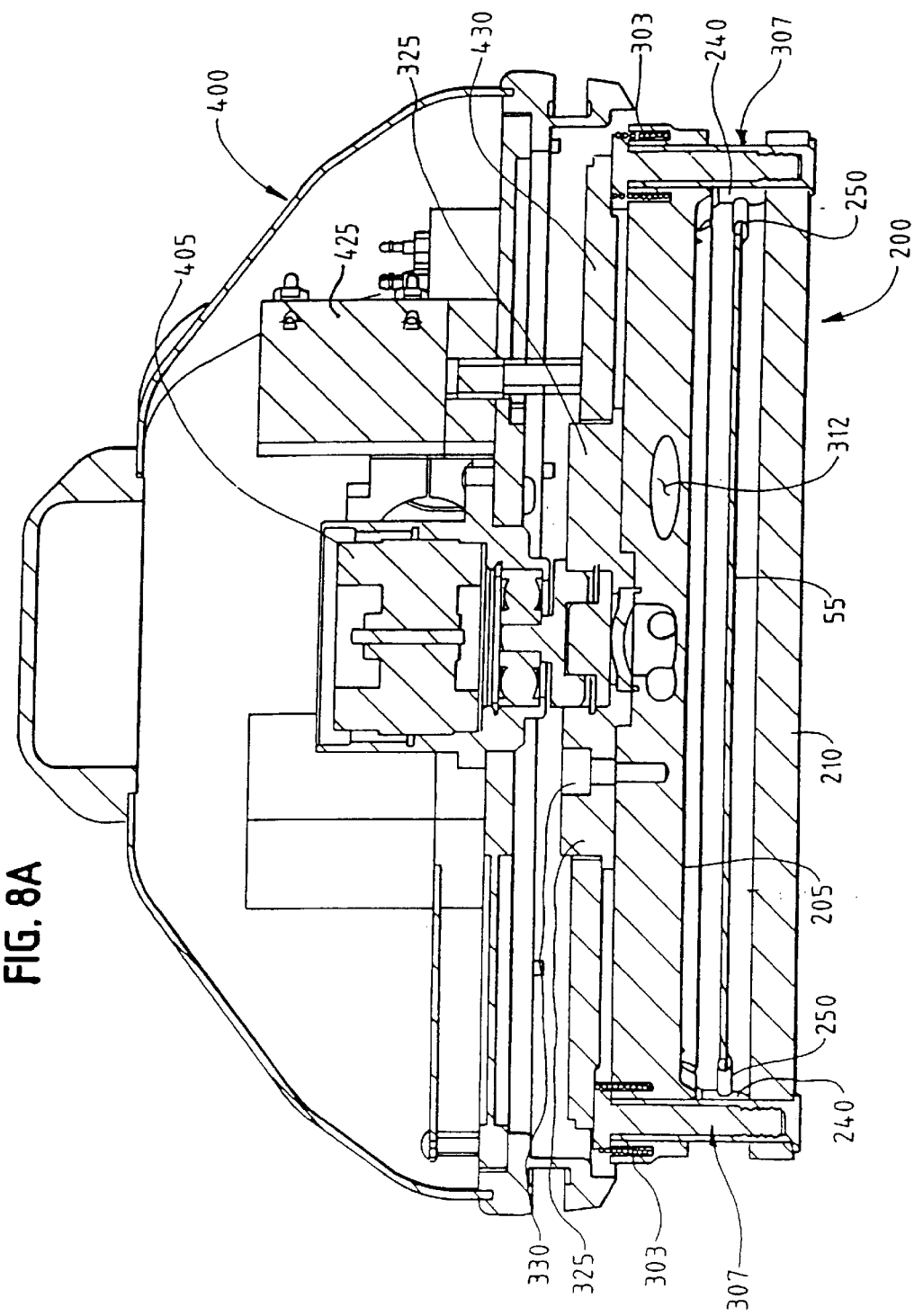
FIGS. 8A and 8B are cross-sectional views showing the workpiece housing in an open state and connected to a rotary drive assembly.
Figure 8B:
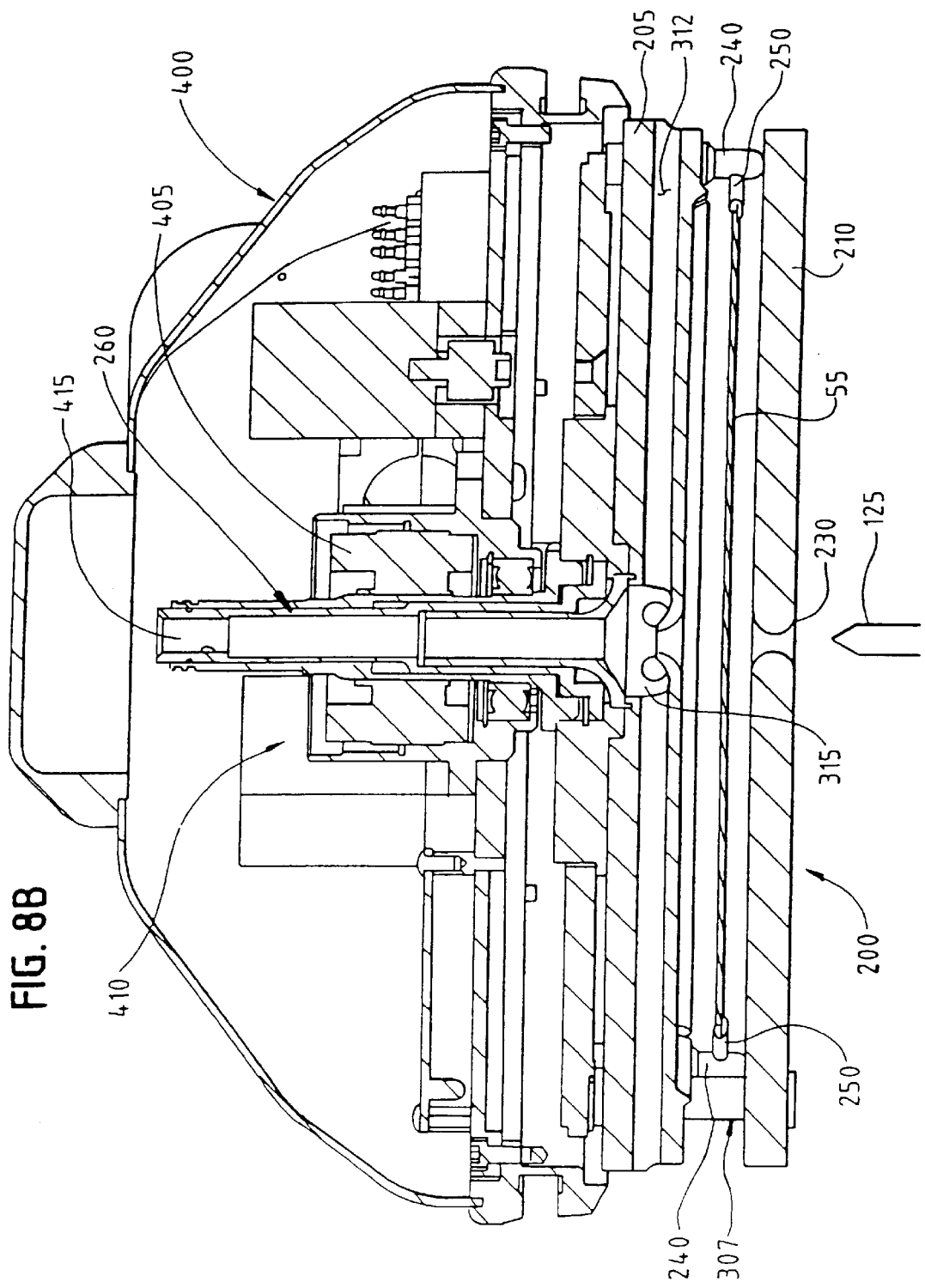

FIGS. 7A and 7B are cross-sectional views showing the reactor 200 in a closed state and connected to a rotary drive assembly, shown generally at 400, while FIGS. 8A and 8B are similar cross-sectional views showing the reactor 200 in an opened state. As shown, shaft 260 extends upward into the rotary drive assembly 400. Shaft 260 is provided with the components necessary to cooperate with a stator 405 to form a rotary drive motor assembly 410.

As in the embodiment of FIG. 1, the upper and lower chamber members 205 and 210 join to define the substantially closed processing chamber 310 that, in the preferred embodiment, substantially conforms to the shape of the workpiece 55. Preferably, the wafer 55 is supported within the chamber 310 in a position in which its upper and lower faces are spaced from the interior chamber faces 215 and 225. As described above, such support is facilitated by the support members 240 and the spacing members 255 that clamp the peripheral edges of the wafer 55 therebetween when the reactor 200 is in the closed position of FIGS. 7A and 7B.

It is in the closed state of FIGS. 7A and 7B that processing of the wafer 55 takes place. With the wafer secured within the processing chamber 310, processing fluid is provided through passageway 415 of shaft 260 and inlet 220 into the interior of chamber 310. Similarly, processing fluid is also provided to the chamber 310 through a processing supply tube 125 that directs fluid flow through inlet 230. As the reactor 200 is rotated by the rotary drive motor assembly 410, any processing fluid supplied through inlets 220 and 230 is driven across the surfaces of the wafer 55 by forces generated through centrifugal acceleration. Spent processing fluid exits the processing chamber 310 from the outlets at the peripheral regions of the reactor 200 formed by notches 295 and 296. Such outlets exist since the support members 240 are not constructed to significantly obstruct the resulting fluid flow. Alternatively, or in addition, further outlets may be provided at the peripheral regions.

Once processing has been completed, the reactor 200 is opened to allow access to the wafer, such as shown in FIGS. 8A and 8B. After processing, actuator 425 is used to drive an actuating ring 430 downward into engagement with upper portions of the fasteners 307. Fasteners 307 are driven against the bias of spring 303 causing the lower chamber member 210 to descend and separate from the upper chamber member 205. As the lower chamber member 210 is lowered, the support members 240 follow it under the influence of gravity, or against the influence of a biasing member, while concurrently lowering the wafer 55. In the lower position, the reactor chamber 310 is opened thereby exposing the wafer 55 for removal and/or allowing a new wafer to be inserted into the reactor 200. Such insertion and extraction can take place either manually, or by an automatic robot.

The foregoing arrangement makes the reactor 200 particularly well-suited for automated workpiece loading and unloading by, for example, a robotic transfer mechanism or the like. As evident from a comparison of FIGS. 7A and 8A, the spacing between the upper surface of the workpiece and the interior chamber wall of the upper chamber member 205 varies depending on whether the reactor 200 is in an open or closed state. When in the open state, the upper surface of the workpiece is spaced from the interior chamber wall of the upper chamber member 205 by a distance, x1, that provides sufficient clearance for operation of, for example, a workpiece transfer arm of a robotic transfer mechanism. When in the closed processing state, the upper surface of the workpiece is spaced from the interior chamber wall of the upper chamber member 205 by a distance, x2, that is less than the distance, x1. The distance, x2, in the disclosed embodiment may be chosen to correspond to the spacing that is desired during workpiece processing operations.

Figure 9:
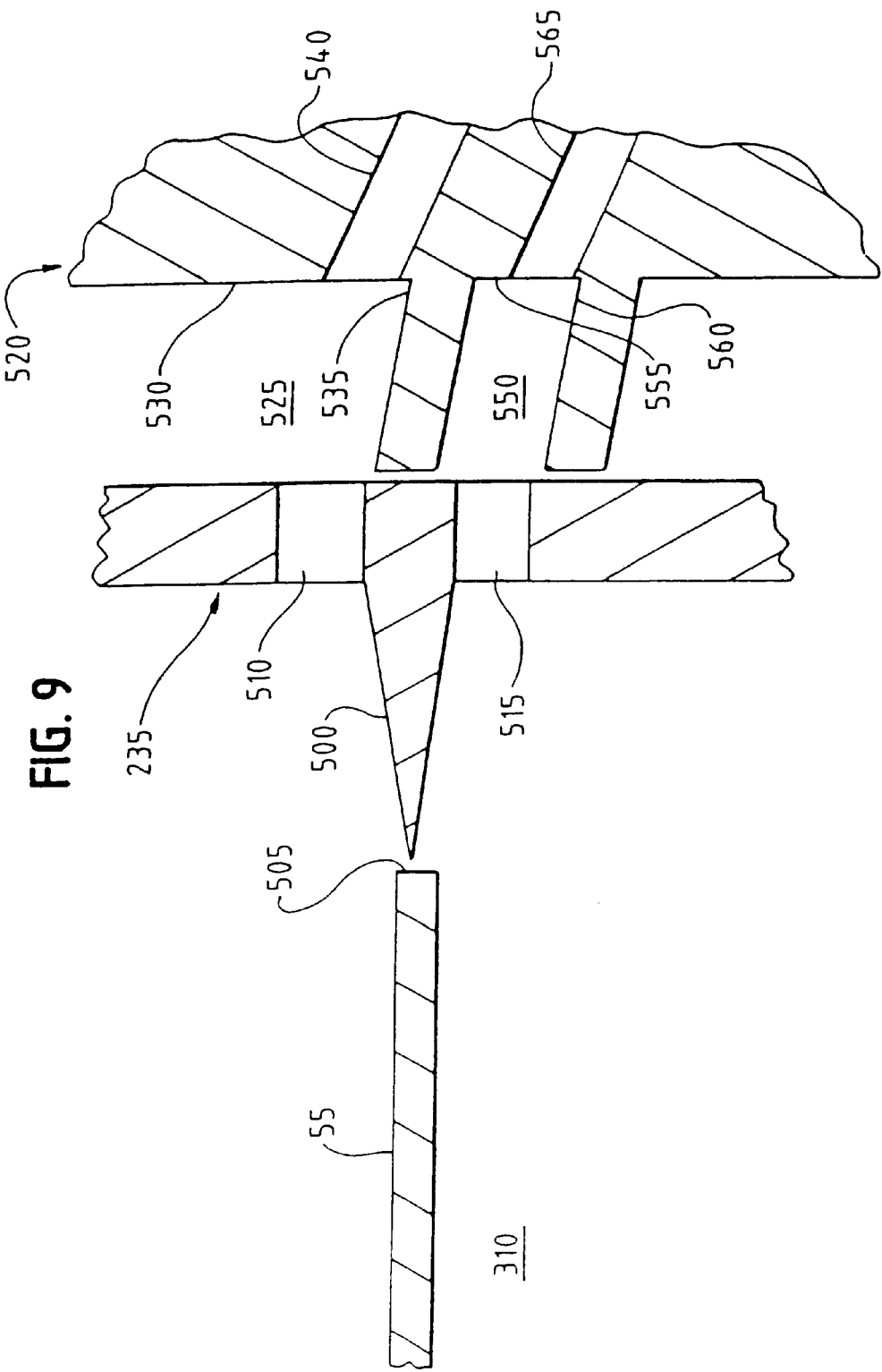
FIG. 9 illustrates one embodiment of an edge configuration that facilitates mutually exclusive processing of the upper and lower wafer surfaces in the workpiece housing.

FIG. 9 illustrates an edge configuration that facilitates separate processing of each side of the wafer 55. As illustrated, a dividing member 500 extends from the sidewall 235 of the processing chamber 310 to a position immediately proximate the peripheral edge 505 of the wafer 55. The dividing member 500 may take on a variety of shapes, the illustrated tapered shape being merely one configuration. The dividing member 500 preferably extends about the entire circumference of the chamber 310. A first set of one or more outlets 510 is disposed above the dividing member 500 to receive spent processing fluid from the upper surface of the wafer 55. Similarly, a second set of one or more outlets 515 is disposed below the dividing member 500 to receive spent processing fluid from the lower surface of the wafer 55. When the wafer 55 rotates during processing, the fluid through supply 415 is provided to the upper surface of the wafer 55 and spreads across the surface through the action of centripetal acceleration. Similarly, the fluid from supply tube 125 is provided to the lower surface of the wafer 55 and spreads across the surface through the action of centripetal acceleration. Because the edge of the dividing member 500 is so close to the peripheral edge of the wafer 55, processing fluid from the upper surface of the wafer 55 does not proceed below the dividing member 500, and processing fluid from the lower surface of the wafer 55 does not proceed above the dividing member 500. As such, this reactor construction makes it possible to concurrently process both the upper and lower surfaces of the wafer 55 in a mutually exclusive manner using different processing fluids and steps.

FIG. 9 also illustrates one manner in which the processing fluids supplied to the upper and lower wafer surfaces may be collected in a mutually exclusive manner. As shown, a fluid collector 520 is disposed about the exterior periphery of the reactor 200. The fluid collector 520 includes a first collection region 525 having a splatter stop 530 and a fluid trench 535 that is structured to guide fluid flung from the outlets 510 to a first drain 540 where the spas fluid from the upper wafer surface may be directed to a collection reservoir for disposal or re-circulation. The fluid collector 520 further includes a second collection region 550 having a further splatter stop 555 and a further fluid trench 560 that is structured to guide fluid flung from the outlets 515 to a second drain 565 where the spent fluid from the lower wafer surface may be directed to a collection reservoir for disposal or re-circulation.

Figure 10:
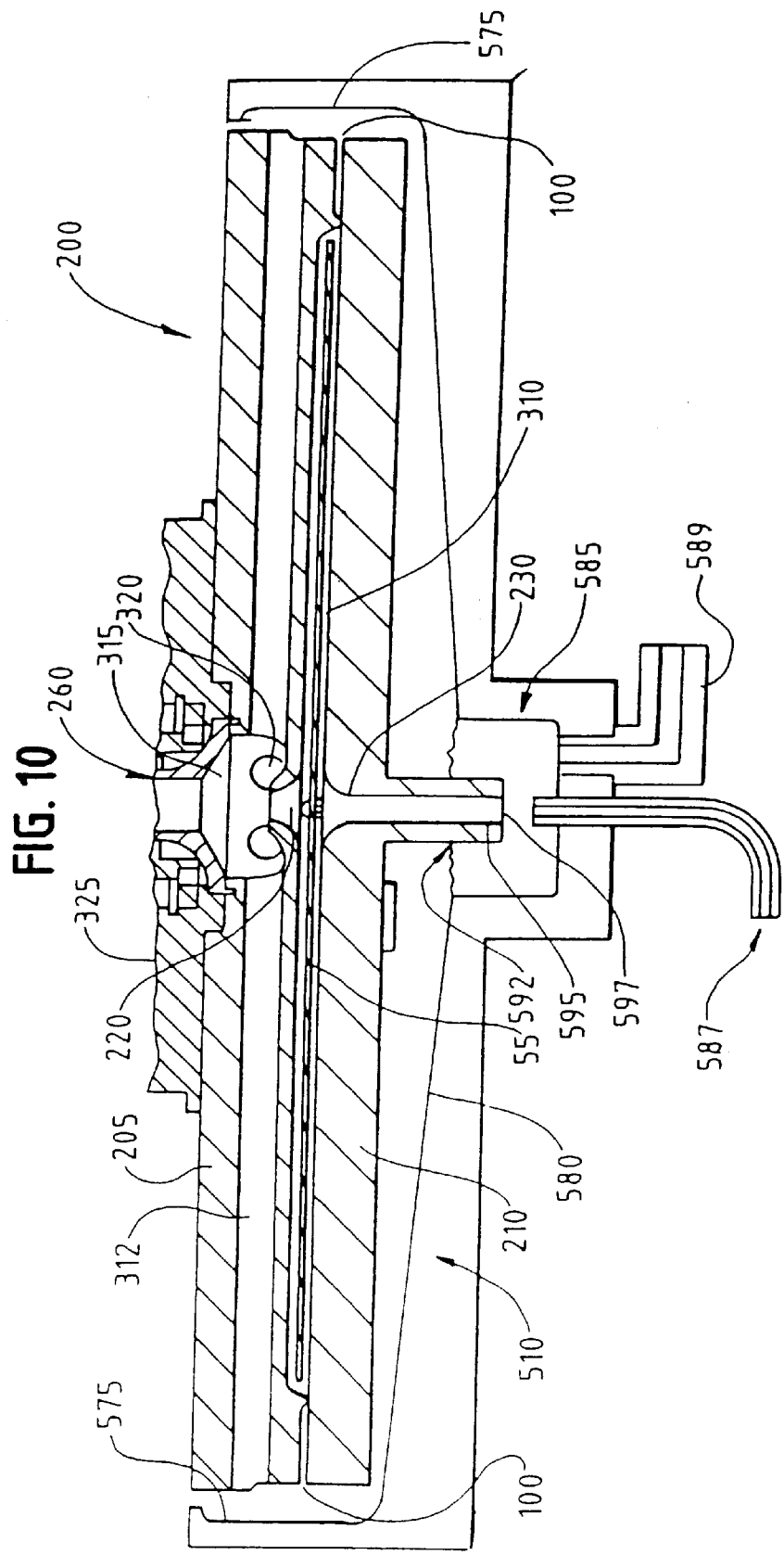
FIG. 10 illustrates an embodiment of the workpiece housing employed in connection with a self-pumping re-circulation system.

FIG. 10 illustrates an embodiment of the reactor 200 having an alternate configuration for supplying processing fluid through the fluid inlet opening 230. As shown, the workpiece housing 20 is disposed in a cup 570. The cup 570 includes sidewalls 575 exterior to the outlets 100 to collect fluid as it exits the chamber 310. An angled bottom surface 580 directs the collected fluid to a sump 585. Fluid supply line 587 is connected to provide an amount of fluid to the sump 585. The sump 585 is also preferably provided with a drain valve 589. An inlet stem 592 defines a channel 595 that includes a first end having an opening 597 that opens to the sump 585 at one end thereof and a second end that opens to the inlet opening 230.

In operation of the embodiment shown in FIG. 10, processing fluid is provided through supply line 587 to the sump 585 while the reactor 200 is spinning. Once the sump 585 is full, the fluid flow to the sump through supply line 587 is eliminated. Centripetal acceleration resulting from the spinning of the reactor 200 provides a pressure differential that drives the fluid through openings 597 and 230, into chamber 310 to contact at least the lower surface of the wafer 55, and exit outlets 100 where the fluid is re-circulated to the sump 585 for further use.

There are numerous advantages to the self-pumping re-circulation system illustrated in FIG. 10. The tight fluid loop minimizes lags in process parameter control thereby making it easier to control such physical parameters as fluid temperature, fluid flow, etc. Further, there is no heat loss to plumbing, tank walls, pumps, etc. Still further, the system does not use a separate pump, thereby eliminating pump failures which are common when pumping hot, aggressive chemistries.

Figure 11:
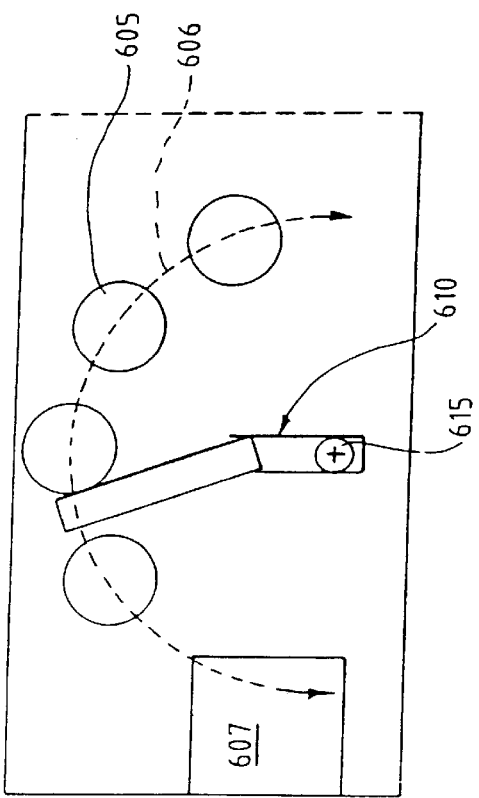
FIGS. 11 and 12 are schematic diagrams of exemplary processing tools that employ the present invention.
Figure 12:
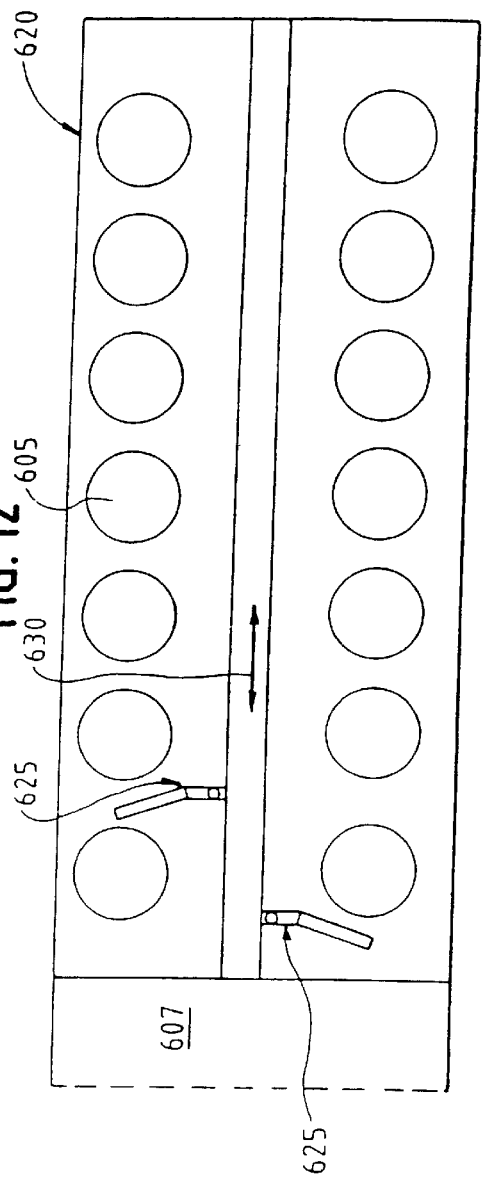

FIGS. 11 and 12 illustrate two different types of processing tools, each of which may employ one or more processing stations including the reactor constructions described above. FIG. 11 is a schematic block diagram of a tool, shown generally at 600, including a plurality of processing stations 605 disposed about an arcuate path 606. The processing stations 605 may all perform similar processing operations on the wafer, or may perform different but complementary processing operations. For example, one or more of the processing stations 605 may execute an electrodeposition process of a metal, such as copper, on the wafer, while one or more of the other processing stations perform complementary processes such as, for example, clean/dry processing, pre-wetting processes, photoresist processes, etc.

Wafers that are to be processed are supplied to the tool 600 at an input/output station 607. The wafers may be supplied to the tool 600 in, for example, S.M.I.F. pods, each having a plurality of the wafers disposed therein. Alternatively, the wafers may be presented to the tool 600 in individual workpiece housings, such as at 20 of FIG. 1.

Each of the processing stations 605 may be accessed by a robotic arm 610. The robotic arm 610 transports the workpiece housings, or individual wafers, to and from the input/output station 607. The robotic arm 610 also transports the wafers or housings between the various processing stations 605.

In the embodiment of FIG. 11, the robotic arm 610 rotates about axis 615 to perform the transport operations along path 606. In contrast, the tool shown generally at 620 of the FIG. 12 utilizes one or more robotic arms 625 that travel along a linear path 630 to perform the required transport operations. As in the embodiment of FIG. 10, a plurality of individual processing stations 605 are used, but more processing stations 605 may be provided in a single processing tool in this arrangement.

FIG. 13 illustrates one manner of employing a plurality of workpiece housings 700, such as those described above, in a batch processing apparatus 702. As shown, the workpiece housings 700 are stacked vertically with respect to one another and are attached for rotation by a common rotor motor 704 about a common rotation axis 706. The apparatus 702 further includes a process fluid delivery system 708. The delivery system 708 includes a stationary manifold 710 that accepts processing fluid from a fluid supply (not shown). The stationary manifold 710 has an outlet end connected to the input of a rotating manifold 712. The rotating manifold 712 is secured for co-rotation with the housings 700 and, therefore, is connected to the stationary manifold 710 at a rotating joint 714. A plurality of fluid supply lines 716 extend from the rotating manifold 712 and terminate at respective nozzle portions 718 proximate inlets of the housings 700. Nozzle portions 718 that are disposed between two housings 700 are constructed to provide fluid streams that are directed in both the upward and downward directions. In contrast, the lowermost supply line 716 includes a nozzle portion 718 that directs a fluid stream only in the upward direction. The uppermost portion of the rotating manifold 712 includes an outlet 720 that provides processing fluid to the fluid inlet of the uppermost housing 700.

The batch processing apparatus 702 of FIG. 13 is constructed to concurrently supply the same fluid to both the upper and lower inlets of each housing 700. However, other configurations may also be employed. For example, nozzle portions 718 may include valve members that selectively open and close depending on whether the fluid is to be supplied through the upper and/or lower inlets of each housing 700. In such instances, it may be desirable to employ an edge configuration, such as the one shown in FIG. 9, in each of the housings 700 to provide isolation of the fluids supplied to the upper and lower surfaces of the wafers 55. Still further, the apparatus 702 may include concentric manifolds for supplying two different fluids concurrently to individual supply lines respectively associated with the upper and lower inlets of the housings 700.

An embodiment of the reactor that is particularly well-suited for integration in an automated processing tool is illustrated in FIG. 14. The reactor, shown generally at 800, includes features that cooperate in a unique manner to allow a robotic arm or the like to insert and extract a workpiece to and from the reactor 800 during loading and unloading operations while also maintaining relatively tight clearances between the workpiece and the interior chamber walls of the reactor during processing.

One of the principal differences between the reactor embodiments described above and the reactor 800 of FIG. 14 lies in the nature of the workpiece support assembly. As shown, reactor 800 includes a workpiece support assembly, shown generally at 805, that is associated with the lower chamber member 210. In accordance with the illustrated embodiment, the workpiece support assembly 805 includes a plurality of workpiece support members 810 that extend through the lower chamber member 210. The workpiece support members 810 are supported at a lower end thereof by a biasing member 815. At the end of the workpiece support member 810 that is distal the biasing member 815, the workpiece support member 810 terminates at a workpiece support surface 820 and a guide structure 825. The guide structure 825 from the workpiece support surface 820 and terminates at a frustoconical section 830. The guide structure 825 assists in urging the peripheral edges of the workpiece into proper alignment with the workpiece support surface 820 thereby ensuring proper registration of the workpiece during processing. The guide structure 825 may also serve as a spacer that defines the clearance between the interior chamber wall of the upper chamber member 205 and the upper surface of the workpiece.

The biasing member 815 of the illustrated embodiment serves to bias the workpiece support members 810 in an upward direction when the upper and lower chamber members 205 and 210 are in the illustrated open condition in which the reactor 800 is ready for loading or unloading the workpiece. The biasing member 815 may take on various forms. For example, a single biasing structure may be used that is common to all of the workpiece support members 810. Alternatively, as shown in the disclosed embodiment, individual biasing structures may be respectively associated with individual ones of the workpiece support members 810. The individual biasing structures are in the form of leaf springs 835 but, for example, may alternatively be in the form of coil spring actuators or the like.

Figure 15:
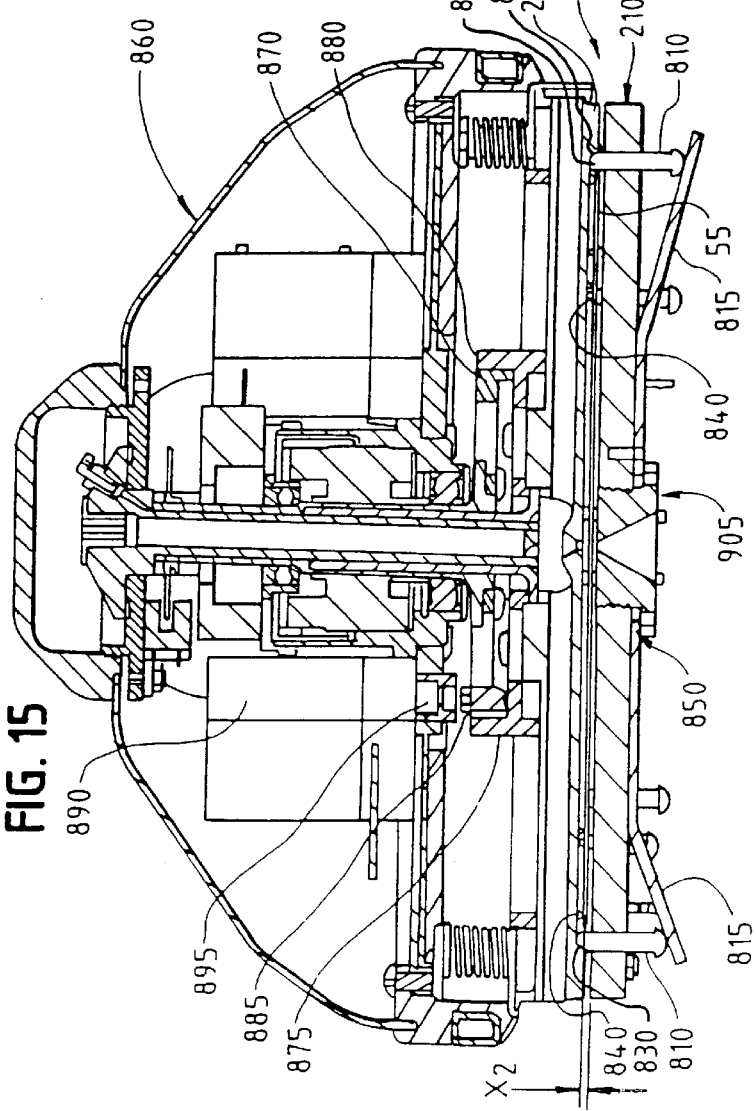
FIG. 15 illustrates the embodiment of the reactor of FIG. 14 wherein the reactor is in a closed processing state.

As in the embodiment of the reactor described above, the upper and lower chamber members 205 and 210 of reactor 800 are movable with respect to one another between the open condition of FIG. 14 to a closed processing condition as illustrated in FIG. 15. As the chamber members 205 and 210 move toward one another, the frustoconical sections 830 of the workpiece support members 810 engage the interior chamber wall of the upper chamber member 205. Continued movement between the chamber members 205 and 210 drives the workpiece support members 810 against the leaf springs 835 until the workpiece is clamped between the support surfaces 820 of the workpiece support members 810 and corresponding projections 840 that extend from the interior chamber wall of the upper chamber member 205. While in this closed state, the reactor is ready to process the workpiece.

The reactor 800 of FIG. 14 also includes structures which assists in ensuring proper registration between the upper and a lower chamber members 210 and 205 as they are brought proximate one another to their processing position. In the illustrated embodiment, these structures are in the form of lead-in pins 845 that extend from one of the chamber members to engage corresponding apertures of the other of the chamber members. Here, the lead-in pins 845 extend from the lower chamber member 210 to engage corresponding apertures (not shown) in the upper chamber member 205. The lead-in pins 845 are in the form of upstanding members that each terminate in a respective frustoconical section that functions as a guide surface.

The foregoing arrangement makes the reactor 800 particularly well-suited for automated workpiece loading and unloading by, for example, a robotic transfer mechanism or the like, particularly one in which the workpiece is directly inserted into the reactor without flipping of the workpiece. As evident from a comparison of FIGS. 14 and 15, the spacing between the lower surface of the workpiece and the interior chamber wall of the lower chamber member 210 varies depending on whether the reactor 800 is in an open or closed state. When in the open state, the lower surface of the workpiece is spaced from the interior chamber wall of the lower chamber member 210 by a distance, x1, that provides sufficient clearance for operation of, for example, a workpiece transfer arm of a robotic transfer mechanism. When in the closed processing state, the lower surface of the workpiece is spaced from the interior chamber wall of the lower chamber member 210 by a distance, x2, that is less than the distance, x1. The distance, x2, in the disclosed embodiment corresponds to the spacing that is desired during workpiece processing operations.

Figure 16:
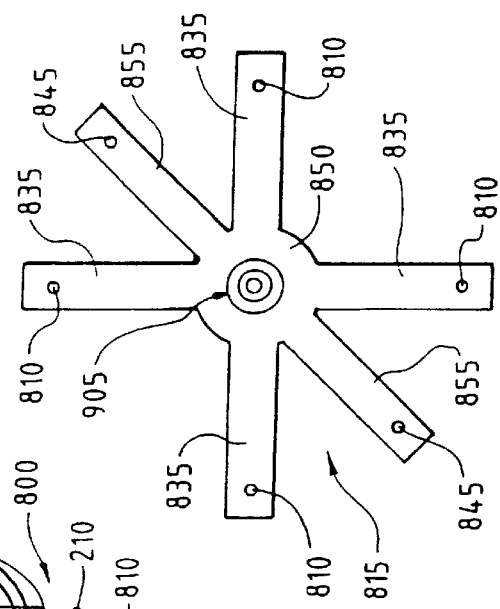
FIG. 16 illustrates one embodiment of a biasing member that may be used in the reactor of FIG. 14.

One embodiment of the biasing member 815 is illustrated in FIG. 16. As shown, the biasing member 815 is comprised of a plurality of leaf springs 835 that extend radially from a central hub portion 850 to positions in which they contact the underside of respective workpiece support members 810. A further plurality of radial members 855 extend from the hub 850 to positions in which they contact the underside of respective lead-in pins 845. Unlike the leaf springs 835, the further plurality of radial members 855 are not necessarily designed to flex as the upper and lower chamber members 210 and 205 move toward the processing position. The biasing member 825 may be formed from a polymer material or the like which is resistant to the chemistry used in the processing environment. When formed from such a material, the workpiece support members 810 and lead-in pins 845 may be formed integral with their respective leaf springs 835 and radial members 855.

In the illustrated embodiment, the central hub portion 850 includes a central aperture 900 that accommodates a securement 905 which connects the biasing member 815 to the underside of the lower chamber member 210. With reference to FIGS. 14 and 15, the securement 905 can be formed to provide the processing fluid inlet through the lower chamber member 210. When the securement 905 is formed in this manner, the reactor 800 is provided with a quick and easy manner of providing different inlet configurations for different processes.

On occasion, it may be desirable to remove the reactor 800 from head portion 860. For example, the reactor 800 may be removed for service or for replacement with a reactor that is designed for executing other processes, or processing other workpiece types.

To this end, the reactor 800 and the head portion 860 are engaged at a connection hub assembly 865 which allows the reactor 800 to be easily connected to and disconnected from the head portion 860. In the illustrated embodiment, the connection hub assembly 865 is comprised of a head connection hub 870 that is fixed to the processing head portion 860, and a reactor connection hub 875 that is fixed to the reactor 800. The connection hubs 870 and 875 are secured to one another during normal operation by, for example, a threaded joint 880. A set screw 885 extends through the head connection hub 870 and may be rotated to engage a surface of or corresponding aperture in the reactor connection hub 875 to thereby prevents the connection hubs 870 and 875 from unscrewing.

When removal of the reactor 800 is desired, the reactor is rotated to align set screw 885 with a corresponding channel sleeve 890 that is fixed to the head portion 860. The channel sleeve 890 is constructed to allow a user to extend a tool therethrough to engage the set screw 885. The set screw is then turned to raise it until it engages and secures with a screw head block 895. Once secured in this manner, the head connection hub 870 is rotationally locked with the head portion 860 thereby allowing the reactor 800 and corresponding reactor connection hub 875 to be unscrewed from the head connection hub 870 to remove the reactor.

In accordance with a still further feature of the reactor 800, a stiffening member 910 formed, for example, from aluminum is secured with the upper chamber member 205. By increasing the stiffness of the upper and/or lower chamber members, higher rotating speeds may be used and, further, the flatness of the interior chamber walls during processing may be increased.

Numerous substantial benefits flow from the use of the disclosed reactor configurations. Many of these benefits arise directly from the reduced fluid flow areas in the reactor chambers. Generally, there is a more efficient use of the processing fluids since very little of the fluids are wasted. Further, it is often easier to control the physical parameters of the fluid flow, such as temperature, mass flow, etc., using the reduced fluid flow areas of the reactor chambers. This gives rise to more consistent results and makes those results repeatable.

The foregoing constructions also give rise to the ability to perform sequential processing of a single wafer using two or more processing fluids sequentially provided through a single inlet of the reaction chamber. Still further, the ability to concurrently provide different fluids to the upper and lower surfaces of the wafer opens the opportunity to implement novel processing operations. For example, a processing fluid, such as HF liquid, may be supplied to a lower fluid inlet of the reaction chamber for processing the lower wafer surface while an inert fluid, such as nitrogen gas, may be provided to the upper fluid inlet As such, the HF liquid is allowed to react with the lower surface of the wafer while the upper surface of the wafer is effectively isolated from HF reactions. Numerous other novel processes may also be implemented.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. An apparatus for processing a workpiece comprising:
 a first chamber member having an interior first chamber member wall;
 a second chamber member having an interior second chamber member wall, with the second chamber member moveable relative to the first chamber member from a loading position in which the first and second chamber members are spaced apart from each other, to a processing position where the first and second chamber members are engaged to each other;
 at least one workpiece support on the first chamber member supporting the workpiece at a first distance from the interior first chamber member wall, when the second chamber member is in the loading position, and supporting the workpiece at a second distance from the interior first chamber member wall, when the second chamber member is in the processing position, with the first distance greater than the second distance.

2. The apparatus of claim 1 wherein the workpiece support comprises:
 a plurality of support members, each having a biasing member urging the support member to space the workpiece at the first distance from the interior first chamber wall when the second chamber members is in the loading position, and with relative movement between the first and second chamber members urging substantially each support member against a spring force to move each support member to space the workpiece at the second distance from the first interior chamber wall, when the second chamber member is in the processing position.

3. The apparatus of claim 2 wherein first and second chamber members move linearly relative to each other.

4. The apparatus of claim 2 wherein the biasing member comprises at least one leaf spring.

5. The apparatus of claim 2 further comprising:
 a first fluid inlet in the first interior chamber wall for delivering a first processing fluid onto a first side of the workpiece, and a second fluid inlet in the second interior chamber wall for delivering a second fluid onto a second side of the workpiece.

6. The apparatus of claim 1 and further comprising:
 at least one fluid inlet in at least one of the first and second interior chamber walls for delivering processing fluid onto the workpiece.

7. An apparatus for processing a workpiece, comprising:
 an upper chamber member;

a lower chamber member;

the upper chamber member and the lower chamber member relatively movable from a loading position, where the upper and lower chamber members are spaced apart, to a processing position, where the upper and lower chamber members both engage the workpiece, to prevent movement of the workpiece relative to the upper and lower chamber members;

at least one fluid inlet in at least one of the upper and lower interior chamber walls;

a workpiece support assembly on the lower chamber member, the workpiece support assembly having a plurality of workpiece support members engaging peripheral workpiece edges of the workpiece and holding the workpiece at a first distance from the lower interior chamber member when the upper and lower chamber members are in the loading position, and holding the workpiece at a second distance, less than the first distance, from the lower interior chamber member when the upper and lower chamber members are in the processing position.

8. The apparatus of claim 7 wherein the workpiece support members support the workpiece in a position to allow distribution of a fluid supplied through the at least one processing fluid inlet across at least one face of the workpiece via centrifugal force.

9. The apparatus of claim 7 wherein the at least one fluid inlet extends through the upper interior chamber wall, to deliver processing fluid to substantially an entire upper surface of the workpiece, the apparatus further comprising a second processing fluid inlet extending through the lower interior chamber wall to deliver fluid to substantially an entire a lower surface of the workpiece.

10. The apparatus of claim 7 wherein the workpiece support assembly further comprises a biasing member engaging the workpiece support members, the biasing member constantly urging the workpiece support members away from the lower chamber member and with movement of the upper chamber members towards the lower chamber member urging the workpiece support members downwardly, against the bias of the biasing member.

11. The apparatus of claim 7 wherein the plurality of workpiece support members each have an upstanding portion and a support surface; with a biasing member engaging the upstanding portions of the plurality of workpiece support members, the biasing member urging the workpiece support members to space the workpiece at a first distance from the lower chamber member when the upper and lower chamber members are in the loading position and with movement of the upper chamber member towards the lower chamber member urging the workpiece support members against the bias of the biasing member, to move the workpiece support members so that they support the workpiece at a second distance from the lower chamber member, when the upper and lower chamber members are in the processing position.

12. The apparatus of claim 11 wherein the biasing member comprises a plurality of leaf spring members extending from a central hub, with end portions of the leaf spring members contacting respective upstanding members of the workpiece support members.

13. The apparatus of claim 12 wherein the plurality of workpiece support members extend through the lower chamber member and wherein the biasing member is secured to a central location of the lower chamber member.

14. The machine of claim 7 wherein the upper chamber member includes an upper interior wall and the lower chamber member includes a lower interior wall parallel to the upper interior wall.

15. The machine of claim 14 further including a plurality of top spacing members on the upper interior wall.

* * * * *